US009990451B2

(12) United States Patent
Hunsche et al.

(10) Patent No.: US 9,990,451 B2
(45) Date of Patent: Jun. 5, 2018

(54) PROCESS WINDOW OPTIMIZER

(71) Applicant: ASML NETHERLANDS B.V., Veldhoven (NL)

(72) Inventors: Stefan Hunsche, Santa Clara, CA (US); Venu Vellanki, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 381 days.

(21) Appl. No.: 14/616,905

(22) Filed: Feb. 9, 2015

(65) Prior Publication Data

US 2015/0227654 A1 Aug. 13, 2015

Related U.S. Application Data

(60) Provisional application No. 61/939,071, filed on Feb. 12, 2014, provisional application No. 61/943,834, filed on Feb. 24, 2014.

(51) Int. Cl.
*G06F 17/50* (2006.01)
*H01L 21/66* (2006.01)
*G03F 7/20* (2006.01)

(52) U.S. Cl.
CPC .......... *G06F 17/5009* (2013.01); *G03F 7/705* (2013.01); *G03F 7/70525* (2013.01); *H01L 22/20* (2013.01)

(58) Field of Classification Search
CPC .................................................. G06F 17/5009
USPC ............................................................ 716/54
See application file for complete search history.

(56) References Cited

U.S. PATENT DOCUMENTS

| 5,777,901 | A | 7/1998 | Berezin et al. |
| 7,689,948 | B1* | 3/2010 | White ................... G06F 17/504 324/537 |
| 8,438,508 | B2 | 5/2013 | Liu |
| 2008/0148198 | A1* | 6/2008 | Kyoh ....................... G03F 1/36 716/52 |
| 2008/0295046 | A1* | 11/2008 | Su ........................ G06F 17/5068 716/136 |

(Continued)

FOREIGN PATENT DOCUMENTS

| JP | 2004-053683 | 2/2004 |
| JP | 2004-185019 | 7/2004 |

(Continued)

OTHER PUBLICATIONS

International Search Report dated Apr. 9, 2015 in International Patent Application No. PCT/EP2015/050168.

(Continued)

Primary Examiner — Suresh Memula
(74) Attorney, Agent, or Firm — Pillsbury Winthrop Shaw Pittman LLP

(57) ABSTRACT

Disclosed herein is a computer-implemented defect prediction method for a device manufacturing process involving processing a pattern onto a substrate, the method comprising: identifying a processing window limiting pattern (PWLP) from the pattern; determining a processing parameter under which the PWLP is processed; and determining or predicting, using the processing parameter, existence, probability of existence, a characteristic, or a combination thereof, of a defect produced from the PWLP with the device manufacturing process.

20 Claims, 8 Drawing Sheets

(56) References Cited

U.S. PATENT DOCUMENTS

2010/0162197 A1 6/2010 Ye et al.
2010/0325595 A1* 12/2010 Song .................. G06F 17/5081
716/108

FOREIGN PATENT DOCUMENTS

| JP | 2005-500671 | 1/2005 |
|---|---|---|
| JP | 2007-519981 | 7/2007 |
| JP | 2008-262014 | 10/2008 |
| JP | 2010-114444 | 5/2010 |
| JP | 2011-100121 | 5/2011 |
| JP | 2013-254974 | 12/2013 |

OTHER PUBLICATIONS

Duo Ding et al., "Machine Learning based Lithographic Hotspot Detection with Critical-Feature Extraction and Classification," International Conference on Design and Technology, pp. 219-222 (May 18, 2009).
Hyunjo Yang et al., "New OPC Verification Method using Die-to-Database Inspection," Proc. of SIE, vol. 6152, pp. 615232-1-615232-9 (Mar. 24, 2006).
Anonymous, "Defect Prediction," Research Disclosure, vol. 604, No. 33, pp. 1-7 (Aug. 2014).
Taiwanese Office Action dated Oct. 20, 2016 in corresponding Taiwan Patent Application No. 104102587.
Japanese Office Action dated Jul. 13, 2017 in corresponding Japanese Patent Application No. 2016-549131.

\* cited by examiner

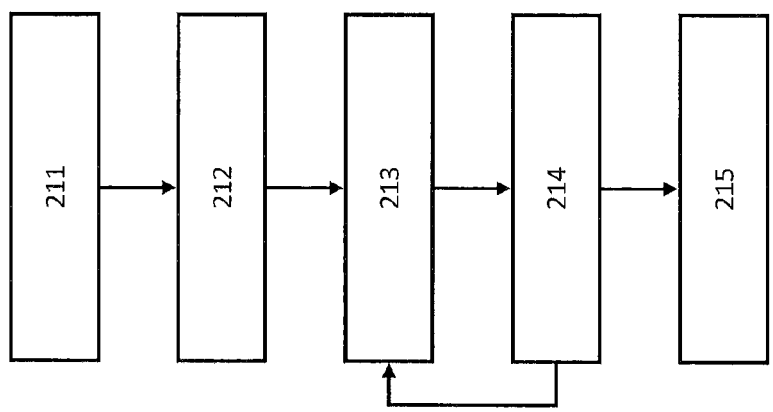

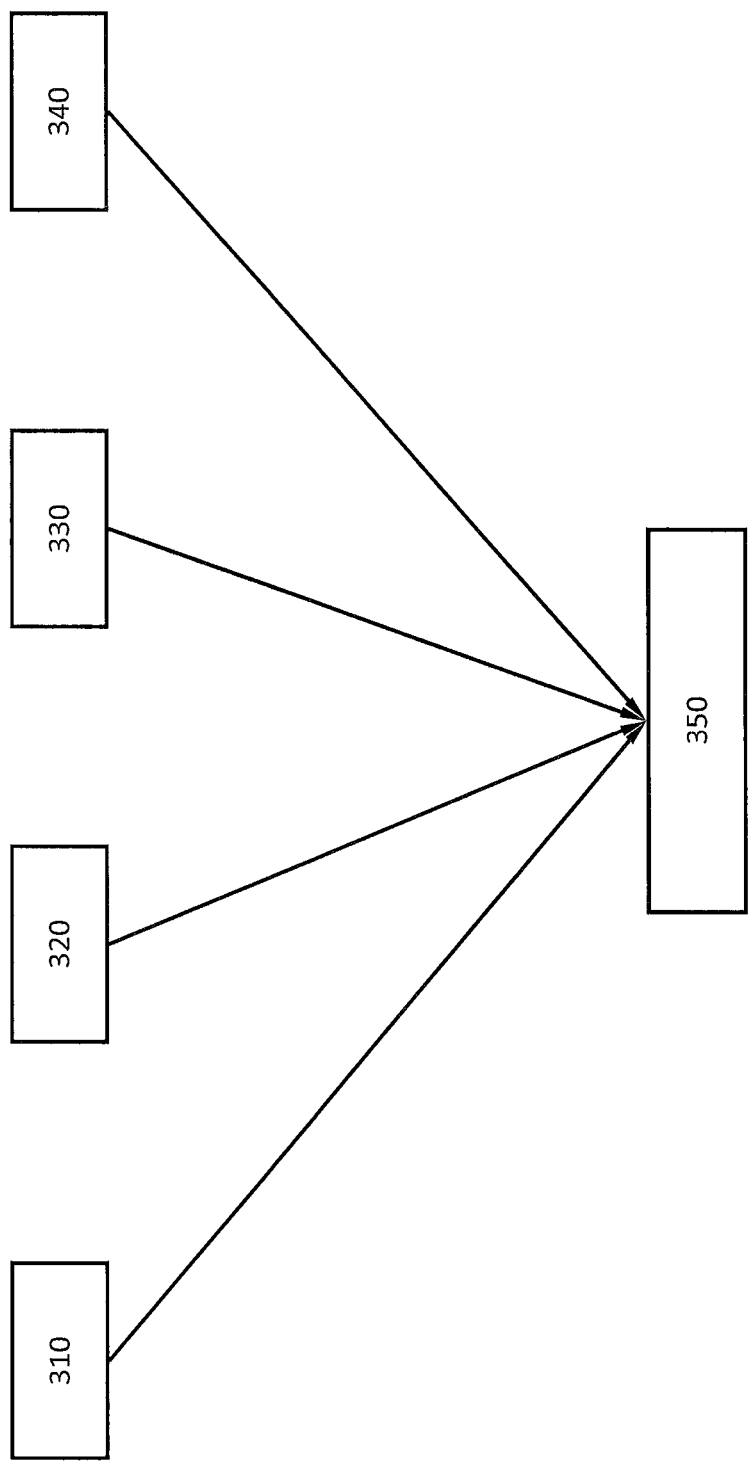

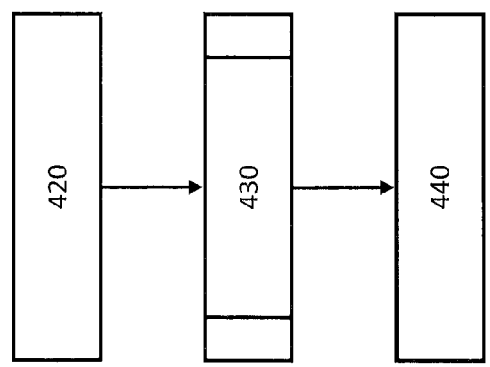

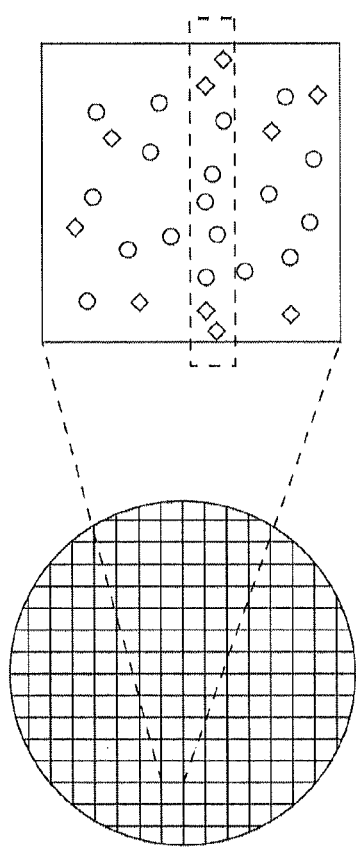
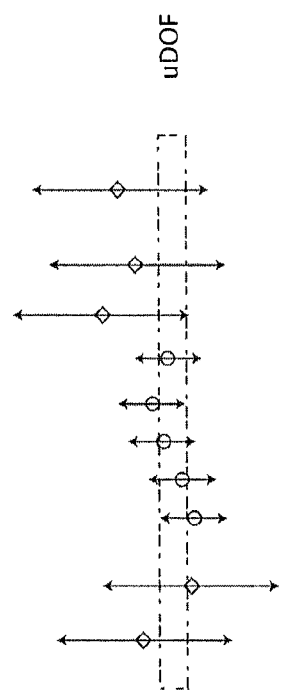
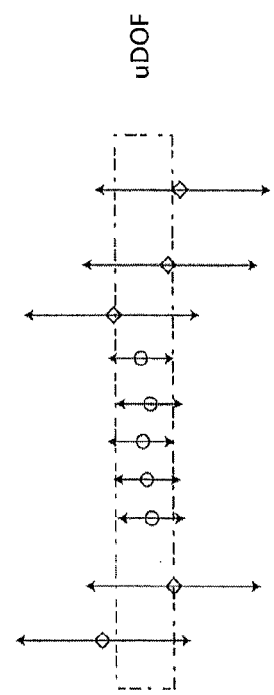
Fig. 5A
Fig. 5B
Fig. 5C

PROCESS WINDOW OPTIMIZER

CROSS-REFERENCE TO RELATED APPLICATIONS

This application claims the benefit under 35 USC 119(e) of prior U.S. Provisional Patent Application No. 61/939,071, filed Feb. 12, 2014 and U.S. Provisional Patent Application No. 61/943,834, filed Feb. 24, 2014, all of which are hereby incorporated by reference in the present disclosure in their entirety.

FIELD

The present invention relates to a method of optimizing the performance of semiconductor manufacturing process. The method may be used in connection with a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

SUMMARY

Disclosed herein is a computer-implemented defect determination or prediction method for a device manufacturing process involving processing patterns onto a substrate, the method comprising: identifying one or more processing window limiting patterns (PWLPs) from the patterns; determining one or more processing parameters under which the PWLPs are processed; determining or predicting, using the one or more processing parameters, existence, probability of existence, one or more characteristics, or a combination thereof, of a defect produced from at least one of the PWLPs with the device manufacturing process. In an embodiment, the one or more processing parameters are determined immediately before the PWLPs are processed. In an embodiment, the defect is undetectable before the substrate is irreversibly processed. The fact that the defect is undetectable may be due to the limited quality of the inspection tools used to do the standard inspection. If such a defect is predicted using the computer-implemented defect prediction method disclosed herein, the specific defect may be inspected by a non-standard inspection tool to further assess the severity of the predicted defect. Alternatively, the defect may be too small to be detected at all using any of the inspection tools available at the time of drafting the text. In such case, the prediction of the defect using the method disclosed herein may be used to decide to rework the die or wafer to avoid the predicted defect on the product.

According to an embodiment, determining or predicting, using the one or more processing parameters, existence, probability of existence, one or more characteristics, or a combination thereof, further uses a characteristic of the PWLPs, a characteristic of the patterns, or both.

According to an embodiment, the method further comprises adjusting the one or more processing parameters using the existence, the probability of existence, the one or more characteristics, or a combination thereof, of the defect. In an embodiment, determining or predicting existence, probability of existence, one or more characteristics, or a combination thereof, of a defect, and adjusting the one or more processing parameters, may be carried out reiteratively.

According to an embodiment, the method further comprises determining or predicting, using the adjusted one or more lithographic parameters, existence, probability of existence, one or more characteristics, or a combination thereof, of a residue defect produced from the at least one of the PWLPs using the device manufacturing process.

According to an embodiment, the method further comprises determining process windows of the PWLPs.

According to an embodiment, the method further comprises compiling the one or more processing parameters into a processing parameters map.

According to an embodiment, the one or more PWLPs are identified using an empirical model or a computational model.

According to an embodiment, the one or more processing parameters are selected from a group consisting of focus, dose, source parameters, projection optics parameters, data obtained from metrology and data from operator of the processing apparatus.

According to an embodiment, the data obtained from metrology are obtained from a diffractive tool, or an electron microscope.

According to an embodiment, the one or more processing parameters are determined or predicted using model or by querying a database.

According to an embodiment, determining or predicting the existence, the probability of existence, the one or more characteristics, or a combination thereof, of the defect comprises comparing the one or more processing parameters with the process windows.

According to an embodiment, determining or predicting the existence, the probability of existence, the one or more characteristics, or a combination thereof, of the defect comprises using a classification model with the one or more processing parameters as input to the classification model.

According to an embodiment, the classification model is selected from a group consisting of logistic regression and multinomial logit, probit regression, the perceptron algorithm, support vector machines, import vector machines, and linear discriminant analysis.

According to an embodiment, determining or predicting the existence, the probability of existence, the one or more characteristics, or a combination thereof, of the defect comprises simulating an image or expected patterning contours of at least one of the PWLPs under the processing parameters and measuring the image or contour parameters.

According to an embodiment, the device manufacturing process involves using a lithography apparatus.

Disclosed herein is a method of manufacturing a device involving processing patterns onto a substrate or onto a die of the substrate, the method comprising: determining processing parameters before processing the substrate or the die; predicting or determining existence of a defect, probability of existence of a defect, a characteristic of a defect, or a combination thereof using the processing parameters before processing the substrate or the die, and using a characteristic of the substrate or the die, a characteristic of the geometry of patterns to be processed onto the substrate or the die, or both; adjusting the processing parameters based on the prediction or determination so as to eliminate, reduce the probability or severity of the defect.

According to an embodiment, the method further comprises identifying one or more processing window limiting patterns (PWLPs) from the patterns.

According to an embodiment, the defect is a defect produced from at least one of the PWLPs.

According to an embodiment, the characteristic of the substrate or the die is a process window of at least one of the PWLPs.

Disclosed herein is a method of manufacturing a device involving processing patterns onto a batch of substrates, the method including: processing the batch of substrates, destructively inspecting less than 2%, less than 1.5%, or less than 1% of the batch to determine existence of defects in the patterns processed onto the substrates.

According to an embodiment, the batch of substrates are processed using a lithography apparatus.

Disclosed herein is a method of manufacturing a device comprising: the computer-implemented defect prediction method described above and at least partially indicating which PWLPs to inspect based on the determined or predicted existence, probability of existence, one or more characteristics, or a combination thereof, of the defect.

According to an embodiment, the defect is one or more selected from: necking, line pull back, line thinning, CD error, overlapping, resist top loss, resist undercut and/or bridging.

Disclosed herein is a defect determination or prediction method for a lithographic process, wherein the method comprises a step of determining or predicting existence, probability of existence, a characteristic, or a combination thereof, of a defect using a simulation of at least a part of the lithographic process.

According to an embodiment, the lithographic process comprises a device manufacturing process involving processing a pattern onto a substrate, the determined or predicted existence, probability of existence, characteristic, or combination thereof, of the defect being part of the pattern.

According to an embodiment, the defect is determined or predicted before the pattern is irreversibly processed onto the substrate.

According to an embodiment, the pattern is irreversibly processed onto the substrate when the pattern is etched into at least part of the substrate, or when at least a part of the pattern is used for implanting ions into the substrate.

According to an embodiment, the method comprises determining or predicting existence, probability of existence, characteristic, or combination thereof, of the defect for every substrate processed using the lithographic process.

According to an embodiment, a production parameter of a lithographic production tool is dependent on the step of determining or predicting existence, probability of existence, characteristic, or combination thereof, of the defect, the lithographic production tool being configured for performing at least one step in the lithographic process.

Disclosed herein is a defect classification method for classifying a defect or a possible defect in a lithographic process, the method comprising a step of classifying the defect or the possible defect using a simulation of at least a part of the lithographic process.

According to an embodiment, the lithographic process comprises a device manufacturing process involving processing a pattern onto a substrate.

Disclosed herein is a method of improving a capture rate of a defect in a lithographic process, the method comprising a step of determining or predicting existence, probability of existence, characteristic, or combination thereof, of the defect using a simulation of at least a part of the lithographic process.

According to an embodiment, the lithographic process comprises a device manufacturing process involving processing a pattern onto a substrate.

Disclosed herein is a method of selecting a pattern to be inspected from a plurality of patterns in a lithographic process, the method comprising a step of selecting the pattern to be inspected at least partially based on a simulation of at least a part of the lithographic process.

According to an embodiment, the lithographic process comprises a device manufacturing process involving processing the plurality of patterns onto a substrate.

According to an embodiment, the selected pattern is inspected to assess whether the selected pattern is defective or whether a part of the selected pattern comprises a defect.

Disclosed herein is a method of defining an accuracy of a determination or prediction of a defect in a lithographic process, the method comprising a step of defining an accuracy of a simulation of at least a part of the lithographic process, the simulation being used for determining or predicting an existence, probability of existence, characteristic, or combination thereof, of the defect.

According to an embodiment, the lithographic process comprises a device manufacturing process involving processing a pattern onto a substrate.

According to an embodiment, the accuracy of the determination or prediction of the defect is higher than an accuracy of a defect inspection tool used in the lithographic process.

Disclosed herein is a computer program product comprising a computer readable medium having instructions recorded thereon, the instructions when executed by a computer implementing any of methods above.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 shows a flow chart for a method of determining existence of defects in a lithography process, according to an embodiment;

FIG. 3 shows exemplary sources of the processing parameters;

FIG. 4B shows an alternative implementation of step 213 of FIG. 2.

FIG. 5A shows an exemplary substrate with many dies.

FIG. 5B shows a usable depth of focus (uDOF) obtained using a traditional method.

FIG. 5C shows a usable depth of focus (uDOF) obtained using a method according to an embodiment described herein.

DETAILED DESCRIPTION

Figure 1:
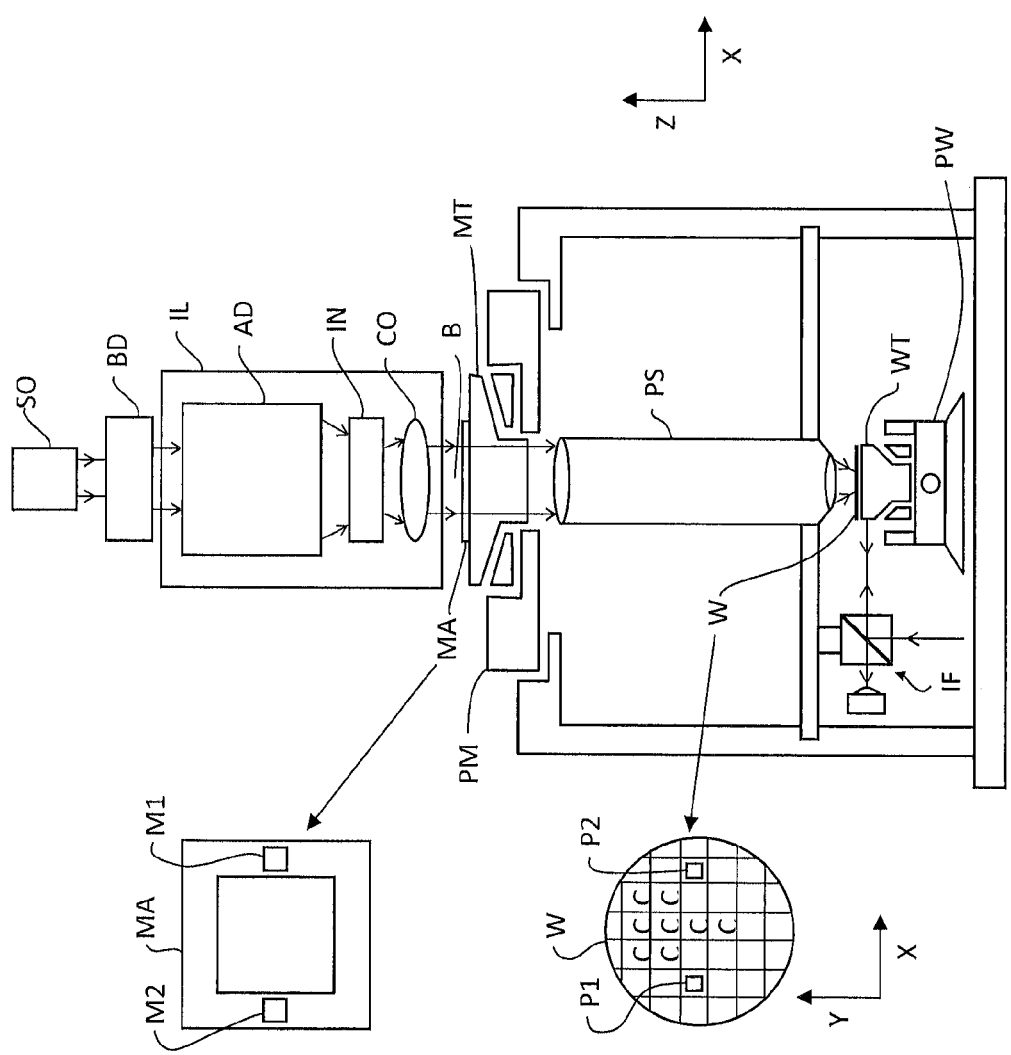
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. UV radiation or DUV radiation).

a support structure MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basic functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane). The relative phase of the projection system PL in its pupil plane may be determined by projecting radiation, for example from a point-like source in an object plane of the projection system PL (i.e. the plane of the patterning device MA), through the projection system PL and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PL (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PL of a state of the art lithographic apparatus LA may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PL in its pupil plane may be determined by projecting radiation, for example from a point-like source in an object plane of the projection system PL (i.e. the plane of the patterning device MA), through the projection system PL and measuring the intensity of radiation in a plane that is conjugate to a pupil plane of the projection system PL, using a detector. The same detector as is used to measure the wavefront to determine aberrations may be used. The projection system PL may comprise a plurality of optical (e.g., lens) elements and may further comprise an adjustment mechanism PA configured to adjust one or more of the optical elements so as to correct for aberrations (phase variations across the pupil plane throughout the field). To achieve this, the adjustment mechanism PA may be operable to manipulate one or more optical (e.g., lens) elements within the projection system PL in one or more different ways. The projection system may have a co-ordinate system wherein its optical axis extends in the z direction. The adjustment mechanism PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PL to correct for apodizations (transmission variation across the pupil plane). The transmission map of a projection system PL may be used when designing a patterning device (e.g., mask) MA for the lithographic apparatus LA. Using a computational lithography technique, the patterning device MA may be designed to at least partially correct for apodizations.

Various patterns on a patterning device may have different process windows (i.e., a space of processing parameters under which a pattern will be produced within specifications). Examples of pattern specifications that relate to potential systematic defects include checks for necking, line pull back, line thinning, CD, edge placement, overlapping, resist top loss, resist undercut and bridging. The process window of all the patterns on a patterning device may be obtained by merging (e.g., overlapping) process windows of each individual pattern. The boundary of the process window of all the patterns contains boundaries of process windows of some of the individual patterns. In another word, these individual patterns limit the process window of all the patterns. These patterns can be referred to as "hot spots" or "process window limiting patterns (PWLPs)," which are used interchangeably herein. When controlling a lithography process, it is possible and economical to focus on the hot spots. When the hot spots are not defective, it is most likely that the all the patterns are not defective.

Processing parameters may vary with position on a substrate and with time (e.g., between substrates, between dies). Such variation may be caused by change in the environment such as temperature and humidity. Other causes of such variations may include drift in one or more components in the processing apparatus such as the source, projection optics, substrate table, height variations of substrate surfaces, etc. in a lithography apparatus. It would be beneficial to be aware of such variations and their effects on PWLPs or potential patterning defects, and to adjust the lithography process to accommodate such variations so as to reduce actual defects. To reduce the computational cost of track these variations, one can again monitor only the hot spots.

FIG. 2 shows a flow chart for a method of determining existence of defects in a lithography process, according to an embodiment. In step 211, hot spots or locations thereof are identified using any suitable method from patterns (e.g., patterns on a patterning device). For example, hot spots may be identified by analyzing patterns on patterns using an empirical model or a computational model. In an empirical model, images (e.g., resist image, optical image, etch image) of the patterns are not simulated; instead, the empirical model predicts defects or probability of defects based on correlations between processing parameters, parameters of the patterns, and the defects. For example, an empirical model may be a classification model or a database of patterns prone to defects. In a computational model, a portion or a characteristic of the images is calculated or simulated, and defects are identified based on the portion or the characteristic. For example, a line pull back defect may be identified by finding a line end too far away from its desired location; a bridging defect may be identified by finding a location where two lines undesirably join; an overlapping defect may be identified by finding two features on separate layers undesirably overlap or undesirably not overlap. An empirical model is usually less computationally expensive than a computational model. It is possible to determine and/or compile process windows of the hot spots into a map, based on hotspot locations and process windows of individual hot spots—i.e. determine process windows as a function of location. This process window map may characterize the layout-specific sensitivities and processing margins of the patterns. In another example, the hot spots, their locations, and/or their process windows may be determined experimentally, such as by FEM wafer inspection or a suitable metrology tool. The defects may include those defects that cannot be detected in an after-development-inspection (ADI) (usually optical inspection), such as resist top loss, resist undercut, etc. Conventional inspection only reveals such defects after the substrate is irreversibly processed (e.g., etched, ion implanted), at which point the wafer cannot be reworked. So, such resist top loss defects cannot be detected using the current optical technology at the time of drafting this document. However, simulation may be used to determine where resist top loss may occur and what the severity would be. Based on this information, it may be either decided to inspect the specific possible defect using a more accurate inspection method (and typically more time consuming) to determine whether the defect needs rework, or it may be decided to rework the imaging of the specific resist layer (remove the resist layer having the resist top loss defect and recoat the wafer to redo the imaging of the specific layer) before the irreversible processing (e.g., etching) is done.

Figure 7:
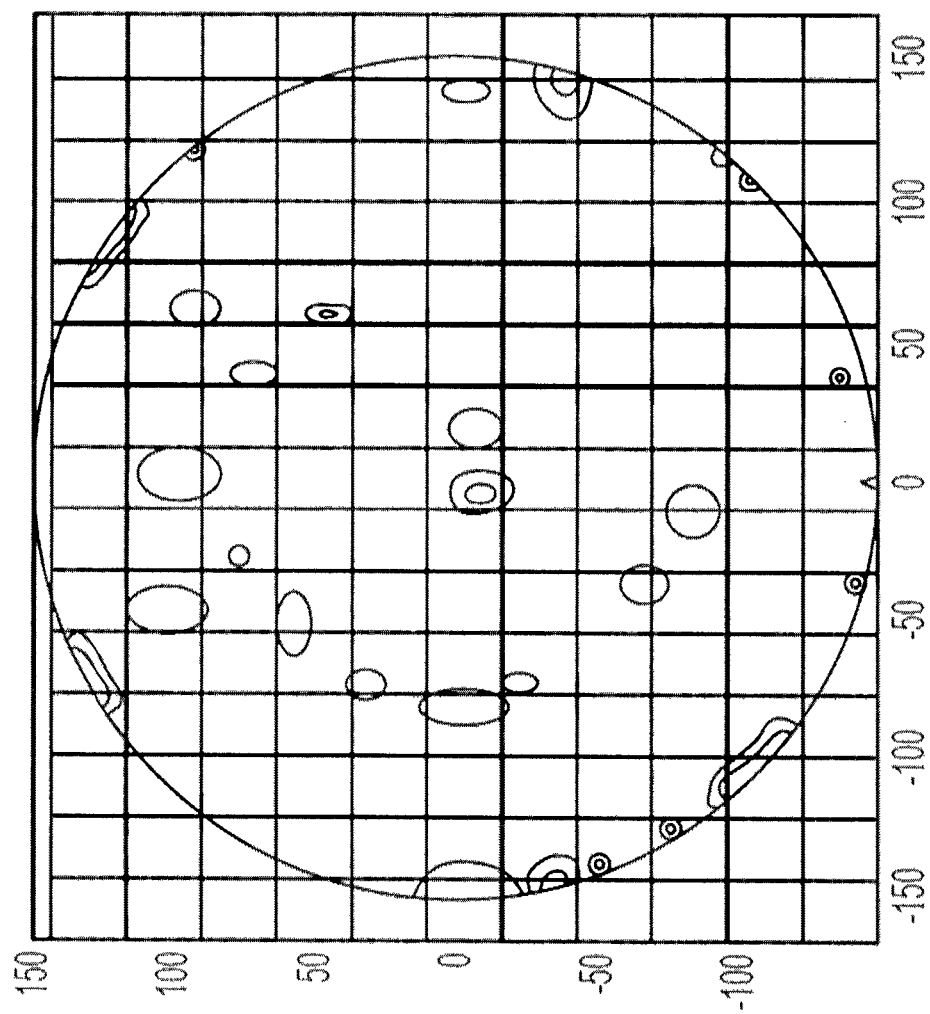
FIG. 7 shows an exemplary map for focus.

In step 212, processing parameters under which the hot spots are processed (e.g., imaged or etched onto a substrate) are determined. The processing parameters may be local dependent on the locations of the hot spots, the dies, or both. The processing parameters may be global—independent of the locations of the hot spots and the dies. One exemplary way to determine the processing parameters is to determine the status of the lithographic apparatus. For example, laser bandwidth, focus, dose, source parameters, projection optics parameters, and the spatial or temporal variations of these parameters, may be measured from the lithographic apparatus. Another exemplary way is to infer the processing parameters from data obtained from metrology performed on the substrate, or from operator of the processing apparatus. For example, metrology may include inspecting a substrate using a diffractive tool (e.g., ASML YieldStar), an electron microscope, or other suitable inspection tools. It is possible to obtain processing parameters for any location on a processed substrate, including the identified hot spots. The processing parameters may be compiled into a map—lithographic parameters, or process conditions, as a function of location. FIG. 7 shows an exemplary map for focus. Of course, other processing parameters may be represented as functions of location, i.e., a map. In an embodiment, the processing parameters may be determined before, and preferably immediately before processing each hotspot. In an alternative embodiment such map comprises processing parameters which may be constituted from different data sources. For example, for estimating focus errors, we may combine wafer metrology data from a metrology system (for example, a diffraction based metrology system such as the ASML YieldStar) with data from the lithographic exposure tool, for example, from a levelling system of the lithographic exposure tool which is used to level an exposure surface underneath the exposure optics of the lithographic exposure tool before exposing a radiation sensitive layer on a substrate. One of the different data sources may, for example, include a relatively high data density, while another data source may, for example, include fewer data points but more accurate data values. Combining these two different data sources enables the generation of a processing parameter map in which the relatively high density data is also relatively accurate due to the calibration to the fewer, more accurate data points of the other data source. Such processing parameter map may, for example, be generated by dividing the full image field of a lithographic tool into sub-areas, for example of approximately 1×1 mm size and determine the processing parameter map from pattern analysis in these sub-areas—for example, determining a Depth-of-Focus map, a Dose-latitude map, a focus map or a dose offset map. Next, the processing parameter value in each sub-area is assigned a number such that each pixel in the sub-area comprises a value of the processing parameter (the pixel size depending on the data density inside the sub-area. Even further alternatively, such processing parameter map may even be generated for a specific reticle or mask comprising the pattern and used to transfer the pattern onto the substrate using the lithographic tool. This would result in a processing parameter map specifically for a specific reticle. Subsequently using, for example, simulations using a model of a specific lithographic exposure tool may even allow to include a characteristic signature of the lithographic exposure tool into the processing parameter map such that the processing parameter map may even become reticle and exposure tool specific. Performing such simulations for multiple tools may even allow a user to select the best lithographic tool for multiple lithographic tools for imaging a specific reticle—of course not taking any temporal drifts of the lithographic exposure tool into account. Such a exposure tool specific map may also be used to allow for adjustments of other processing parameter values than the ones mapped in the processing parameter map to ensure that PWLPs which may need to be imaged at non-favourable processing parameters values still get imaged within specification. For example, when a specific PWLP may not be imaged correctly in focus (which may have an impact on the critical dimension of the PWLP), an other processing parameter value such as dose may be adapted—possibly locally—to ensure that the overall dimension of the PWLP is still within specifications. Finally, each of the above described processing parameter maps may, for example, be converted into a kind of constraint map. Such a constraint map may, for example, indicate within which range the processing parameters at a certain location may vary without endangering the PWLPs. Alternatively, the constraint map may, for example, comprise a weight map indicating which areas of the design require the processing parameters to be close to the optimal parameter setting and what areas of the design allow a larger range of processing parameter values.

In step 213, existence, probability of existence, characteristics, or a combination thereof, of a defect at a hot spot is determined using the processing parameters under which the hot spot is processed. This determination may be simply comparing the processing parameters and the process window of the hot spot—if the processing parameters fall within the process window, no defect exists; if the processing parameters fall outside the process window, at least one defect will be expected to exist. This determination may also be done using a suitable empirical model (including a statistical model). For example, a classification model may be used to provide a probability of existence of a defect. Another way to make this determination is to use a computational model to simulate an image or expected patterning contours of the hot spot under the processing parameters and measure the image or contour parameters. In an embodiment, the processing parameters may be determined immediately (i.e., before processing the pattern or the next substrate) after processing a pattern or a substrate. The determined existence and/or characteristics of a defect may serve as a basis for a decision of disposition: rework or acceptance. In an embodiment, the processing parameters may be used to calculate moving averages of the lithographic parameters. Moving averages are useful to capture long term drifts of the lithographic parameters, without distraction by short term fluctuations.

In optional step 214, the processing parameters may be adjusted using the existence, probability of existence, characteristics, or a combination thereof as determined in step 213 (i.e., the prediction or determination is fed back to adjust the processing parameters), so that the defect is eliminated or its severity reduced. For example, if a hot spot is located on a bump of a substrate, changing the focus may eliminate the defect on that hot spot. Preferably, the processing parameters are adjusted immediately before processing each hot spot. Steps 213 and 214 may be reiterative. Processing parameters may also be adjusted after processing of one or multiple substrates, especially when an average (e.g., a moving average) of the processing parameters are determined, in order to compensate for systematic or slowly varying process variations, or to address a larger number of adjustable processing parameters. Adjustment of processing parameters may include, focus, dose, source or pupil phase adjustments.

In optional step 215, existence and/or characteristics of a residue defect may be determined using the adjusted processing parameters. A residue defect is a defect that cannot be eliminated by adjusting the processing parameters. This determination may be simply comparing the adjusted processing parameters and the process window of the hot spot—if the processing parameters fall within the process window, no residue defect is expected to exist; if the processing parameters fall outside the process window, at least one residue defect will be expected to exist. This determination may also be done using a suitable empirical model (including a statistical model). For example, a classification model may be used to provide a probability of existence of a residue defect. Another way to make this determination is to use a computational model to simulate an image or expected patterning contours of the hot spot under the adjusted processing parameters and measure the image or contour parameters. The determined existence and/or characteristics of a residue defect may serve as a basis for a decision of disposition: rework or acceptance.

Optionally, an indication which hot spots are subject to inspection may be made at least partially based on the determined or predicted existence, probability of existence, one or more characteristics, or a combination thereof, of the residue defect. For example, if a substrate has a probability of having one or more residue defects, the substrate may be subject to substrate inspection. The prediction or determination of residue defects feeds forward to inspection.

FIG. 3 shows exemplary sources of the processing parameters 350. One source may be data 310 of the processing apparatus, such as parameters of the source, projection optics, substrate stage, etc. of a lithography apparatus. Another source may be data 320 from various substrate metrology tools, such as wafer height map, focus map, CDU map, etc. Data 320 may be obtained before substrates were subject to a step (e.g., etch) that prevents reworking of the substrate. Another source may be data 330 from various patterning device metrology tools, mask CDU map, mask film stack parameters variation, etc. Yet another source may be data 340 from an operator of the processing apparatus.

Figure 4A:
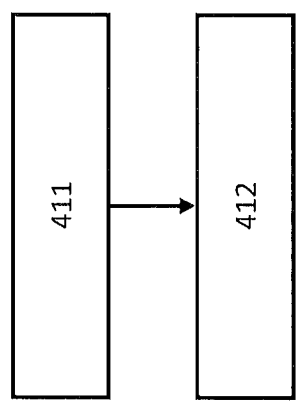
FIG. 4A shows an implementation of step 213 of FIG. 2.

FIG. 4A shows an implementation of step 213 of FIG. 2. In step 411, the process window of a hot spot is obtained, either by using a model or by querying a database. For example, the process window may be a space spanned by processing parameters such as focus and dose. In step 412, processing parameters determined in step 212 of FIG. 2 is compared with the process window. If the processing parameters fall within the process window, no defect exists; if the processing parameters fall outside the process window, at least one defect is expected to exist.

FIG. 4B shows an alternative implementation of step 213 of FIG. 2. The processing parameters 420 may be used as input (e.g., independent variables) to a classification model 430. The processing parameters 420 may include characteristics of the source (e.g., intensity, pupil profile, etc.), characteristics of the projection optics, dose, focus, characteristics of the resist, characteristics of development and post-exposure baking of the resist, and characteristics of etching. The term "classifier" or "classification model" sometimes also refers to the mathematical function, implemented by a classification algorithm, that maps input data to a category. In machine learning and statistics, classification is the problem of identifying to which of a set of categories 440 (sub-populations) a new observation belongs, on the basis of a training set of data containing observations (or instances) whose category membership is known. The individual observations are analyzed into a set of quantifiable properties, known as various explanatory variables, features, etc. These properties may variously be categorical (e.g. "good"—a lithographic process that does not produce defects or "bad"—a lithographic process that produces defects; "type 1", "type 2", . . . "type n"—different types of defects). Classification is considered an instance of supervised learning, i.e. learning where a training set of correctly identified observations is available. Examples of classification models are, logistic regression and multinomial logit, probit regression, the perceptron algorithm, support vector machines, import vector machines, and linear discriminant analysis.

Figure 6:
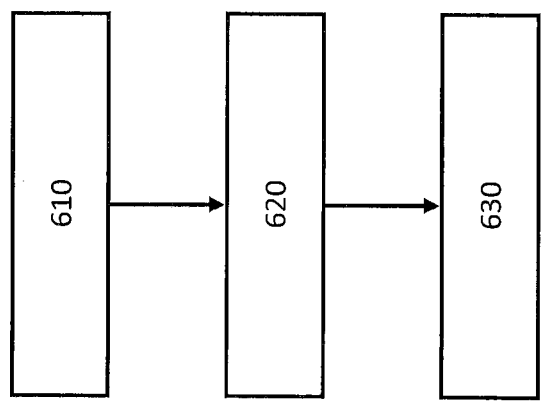
FIG. 6 shows a schematic flow diagram for a processing flow.

One example of the processing parameters is substrate levelling. FIG. 5A shows an exemplary substrate with many dies (depicted as grids). In a die called out, hot spots (depicted as circles) are identified along with less critical positions (i.e., positions that are not process window limiting, depicted as diamonds) in the patterns in the die. FIG. 5B shows a usable depth of focus (uDOF) obtained using a traditional method. uDOF is the depth of focus that falls within the process windows of all the patterns in an exposure slit. FIG. 5C shows a usable depth of focus (uDOF) obtained using a method according to an embodiment described herein, where less critical positions regions (diamonds) are allowed to drift farther away from their respective best focuses to bring the best focuses of the hot spots (circles) closer by adjusting the processing parameters including the substrate levelling, thereby increasing the uDOF. According to an embodiment, a method described herein allows adjustment of processing parameters for each substrate or even each die. FIG. 6 shows a schematic flow diagram for a processing flow. In step 610, processing parameters immediately (e.g., after processing the immediately previous substrate or die) before processing a substrate or a die are determined. In step 620, a prediction or determination of the existence of a defect, probability of existence of a defect, a characteristic of a defect, or a combination thereof is made using the processing parameters immediately before processing the substrate or the die, and using a characteristic of the substrate or the die (e.g., as determined from metrology on the substrate or the die) and/or a characteristic of the geometry of patterns to be processed onto the substrate or the die. In step 630, the processing parameters are adjusted based on the prediction so as to eliminate, reduce the probability or severity of the defect. Alternatively, it may be known from simulations of the layout to be processed that the PWLP may be located at a specific area within a die. In such a situation, the system in the imaging tool which ensures the leveling of the die before exposure in the imaging tool may ensure that this specific area is in focus allowing other areas of the die to divert further from focus to ensure that the PWLP are imaged in spec. The simulations may further be used to determine whether the less critical structures are still imaged correctly due to the less favourable processing conditions because of the preferred leveling accuracy of the area containing the PWLPs. Simulations may also be used to ensure that all types of PWLPs are actually found in the design and that the location of all PWLPs is actually known and preferably put in a PWLP-map. Furthermore, a search algorithm may be applied across a chip design to find, for example, PWLPs which are known and which may, for example, be listed in a kind of "hot-spot database". Although probably somewhat less accurate, such search algorithm may be faster than simulating the full chip design and may be used to relatively quickly find known PWLPs. According to an embodiment, a method described herein allows inspection of less substrates among a production batch while maintaining comparable defect rates to that in a conventional processing flow. A conventional processing flow involves processing (e.g., exposing in a lithography apparatus) a batch of substrates, 2%-3% or more of the batch has to be inspected in order to catch most of the defects. By using the defect prediction method according to the current embodiments, the available metrology data is used to virtually inspect wafers and predict possible defects on these wafers. Because the defect prediction method according to the embodiments is virtual, substantially every wafer produced in the lithographic process may be 'virtually' inspected and thus achieve substantially 100% inspection coverage. This extensive 'virtual' inspection also provides more feedback data which enables a more accurate and quicker corrective action look which typically reduces any drift in the lithographic exposure tools.

The invention may further be described using the following clauses:

1. A computer-implemented defect determination or prediction method for a device manufacturing process involving processing a pattern onto a substrate, the method comprising:
 identifying a processing window limiting pattern (PWLP) from the pattern;
 determining a processing parameter under which the PWLP is processed; and
 determining or predicting, using the processing parameter, existence, probability of existence, a characteristic, or a combination thereof, of a defect produced from the PWLP with the device manufacturing process.
2. The method of clause 1, wherein the determining or predicting the existence, the probability of existence, the characteristic, or the combination thereof, further uses a characteristic of the PWLP, a characteristic of the pattern, or both.
3. The method of clause 1 or clause 2, further comprising adjusting the processing parameter using the existence, the probability of existence, the characteristic, or the combination thereof, of the defect.
4. The method of clause 3, further comprising carrying out reiteratively the determining or predicting the existence, the probability of existence, the characteristic, or the combination thereof, of the defect, and adjusting the processing parameter.
5. The method of clause 3 or clause 4, further comprising determining or predicting, using the adjusted processing parameter, existence, probability of existence, a characteristic, or a combination thereof, of a residue defect produced from the PWLP using the device manufacturing process.
6. The method of clause 5, further comprising indicating which of a plurality of PWLPs to inspect at least partially based on the determined or predicted existence, probability of existence, the characteristic, or the combination thereof, of the residue defect.
7. The method of any of clauses 1 to 6, further comprising determining a process window of the PWLP.
8. The method of clause 7, wherein the determining or predicting the existence, the probability of existence, the characteristic, or the combination thereof, of the defect comprises comparing the processing parameter with the process window.
9. The method any of clauses 1 to 8, further comprising compiling the processing parameter into a processing parameters map.
10. The method of any of clauses 1 to 9, wherein the PWLP is identified using an empirical model or a computational model.
11. The method of any of clauses 1 to 10, wherein the processing parameter is any one or more selected from: focus, dose, a source parameter, a projection optics parameter, data obtained from metrology, and/or data from an operator of a processing apparatus used in the device manufacturing process.
12. The method of clause 11, wherein the processing parameter is data obtained from metrology and the data obtained from metrology is obtained from a diffractive tool, or an electron microscope.
13. The method of any of clauses 1 to 12, wherein the processing parameter is determined or predicted using a model or by querying a database.
14. The method of any of clauses 1 to 13, wherein the determining or predicting the existence, the probability of existence, the characteristic, or the combination thereof, of the defect comprises using a classification model with the processing parameter as input to the classification model.

15. The method of clause 14, wherein the classification model is selected from a group consisting of logistic regression and multinomial logit, probit regression, the perceptron algorithm, support vector machine, import vector machine, and linear discriminant analysis.

16. The method of any of clauses 1 to 12, wherein the determining or predicting the existence, the probability of existence, the characteristic, or the combination thereof, of the defect comprises simulating an image or expected patterning contours of the PWLP under the processing parameter and determining an image or contour parameter.

17. The method of any of clauses 1 to 16, wherein the device manufacturing process involves using a lithography apparatus.

18. The method of any of clauses 1 to 17, wherein the processing parameter is determined immediately before the PWLP is processed.

19. The method of any of clauses 1 to 18, wherein the processing parameter is selected from local processing parameters or global processing parameters.

20. The method of any of clauses 1 to 19, wherein identifying the PWLP includes identifying a location thereof.

21. The method of any of clauses 1 to 20, wherein the defect is undetectable before the substrate is irreversibly processed.

22. A method of manufacturing a device involving processing a pattern onto a substrate or onto a die of the substrate, the method comprising:
   determining a processing parameter before processing the substrate or the die;
   predicting or determining existence of a defect, probability of existence of a defect, a characteristic of a defect, or a combination thereof, using the processing parameter before processing the substrate or the die, and using a characteristic of the substrate or the die, a characteristic of the geometry of a pattern to be processed onto the substrate or the die, or both;
   adjusting the processing parameter based on the prediction or determination so as to eliminate, reduce the probability of or reduce the severity of, the defect.

23. The method of clause 22, further comprising identifying a processing window limiting pattern (PWLP) from the pattern.

24. The method of clause 23, wherein the defect is a defect produced from the PWLP.

25. The method of clause 23, wherein the characteristic of the substrate or the die is a process window of the PWLP.

26. A method of manufacturing a device involving processing a pattern onto a batch of substrates, the method including: processing the batch of substrates, and destructively inspecting less than 2%, less than 1.5%, or less than 1% of the batch to determine existence of a defect in the pattern processed onto the substrates.

27. The method of clause 26, wherein the batch of substrates are processed using a lithography apparatus.

28. A method of manufacturing a device comprising:
   the computer-implemented defect prediction method according to any of clauses 1 to 27; and
   indicating which of plurality of PWLPs to inspect at least partially based on the determined or predicted existence, probability of existence, characteristic, or the combination thereof, of the defect.

29. The method of any of clauses 1 to 28, wherein the defect is one or more selected from: necking, line pull back, line thinning, CD error, overlapping, resist top loss, resist undercut and/or bridging.

30. A computer program product comprising a computer readable medium having instructions recorded thereon, the instructions when executed by a computer implementing the method of any of clauses 1 to 29.

31. A defect determination or prediction method for a lithographic process, wherein the method comprises a step of determining or predicting existence, probability of existence, a characteristic, or a combination thereof, of a defect using a simulation of at least a part of the lithographic process.

32. The defect determination or prediction method according to clause 31, wherein the lithographic process comprises a device manufacturing process involving processing a pattern onto a substrate, the determined or predicted existence, probability of existence, characteristic, or combination thereof, of the defect being part of the pattern.

33. The defect determination or prediction method according to clause 32, wherein the defect is determined or predicted before the pattern is irreversibly processed onto the substrate.

34. The defect determination or prediction method according to clause 33, wherein the pattern is irreversibly processed onto the substrate when the pattern is etched into at least part of the substrate, or when at least a part of the pattern is used for implanting ions into the substrate.

35. The defect determination or prediction method according to any of the clauses 31 to 34, wherein the method comprises determining or predicting existence, probability of existence, characteristic, or combination thereof, of the defect for every substrate processed using the lithographic process.

36. The defect determination or prediction method according to any of the clauses 31 to 35, wherein a production parameter of a lithographic production tool is dependent on the step of determining or predicting existence, probability of existence, characteristic, or combination thereof, of the defect, the lithographic production tool being configured for performing at least one step in the lithographic process.

37. A defect classification method for classifying a defect or a possible defect in a lithographic process, the method comprising a step of classifying the defect or the possible defect using a simulation of at least a part of the lithographic process.

38. The defect classification method according to clause 37, wherein the lithographic process comprises a device manufacturing process involving processing a pattern onto a substrate.

39. A method of improving a capture rate of a defect in a lithographic process, the method comprising a step of determining or predicting existence, probability of existence, characteristic, or combination thereof, of the defect using a simulation of at least a part of the lithographic process.

40. The method according to clause 39, wherein the lithographic process comprises a device manufacturing process involving processing a pattern onto a substrate.

41. A method of selecting a pattern to be inspected from a plurality of patterns in a lithographic process, the method comprising a step of selecting the pattern to be inspected at least partially based on a simulation of at least a part of the lithographic process.

42. The method according to clause 41, wherein the lithographic process comprises a device manufacturing process involving processing the plurality of patterns onto a substrate.

43. The method according to any of the clauses 41 or 42, wherein the selected pattern is inspected to assess whether the selected pattern is defective or whether a part of the selected pattern comprises a defect.

44. A method of defining an accuracy of a determination or prediction of a defect in a lithographic process, the method comprising a step of defining an accuracy of a simulation of at least a part of the lithographic process, the simulation being used for determining or predicting an existence, probability of existence, characteristic, or combination thereof, of the defect.

45. The method according to clause 44, wherein the lithographic process comprises a device manufacturing process involving processing a pattern onto a substrate.

46. The method according to any of the clauses 44 or 45, wherein the accuracy of the determination or prediction of the defect is higher than an accuracy of a defect inspection tool used in the lithographic process.

47. A computer program product comprising a computer readable medium having instructions recorded thereon, the instructions when executed by a computer implementing the method of any of clauses 31 to 46.

48. The computer readable medium of clause 47, wherein the machine executable instructions further comprise instructions for activating at least some of the method steps using a connection to the computer readable medium from a remote computer.

49. The computer readable medium of clause 48, wherein the connection with the remote computer is a secured connection.

50. The computer readable medium of any of the clauses 48 and 49, wherein the processing parameter is provided by the remote computer.

51. The computer readable medium of clause 50, wherein the method is further configured for providing the determination or prediction, using the processing parameter, of the existence, probability of existence, a characteristic, or a combination thereof, of a defect produced with the device manufacturing process back to the remote computer.

52 A defect inspection system configured for inspecting the processing window limiting pattern determined or predicted using the method of any of the clauses 1 to 46 or using the computer readable medium of any of the clauses 47 to 51.

53. The defect inspection system of clause 52, wherein the remote computer is part of the defect inspection system.

54. A substrate comprising the processing window limiting pattern (PWLP) and further comprising a metrology target for determining the processing parameter under which the processing window limiting pattern is processed for determining or predicting existence, probability of existence, a characteristic, or a combination thereof, of a defect produced from the PWLP with the device manufacturing process according to the method of any of the clauses 1 to 46 or according to the computer readable medium of any of the clauses 47 to 51.

55. The substrate according to clause 54, wherein the substrate is a wafer comprising at least some of the layers of an integrated circuit.

56. A lithographic imaging apparatus configured for imaging the processing window limiting pattern and further configured for determining the processing parameter under which the processing window limiting pattern is processed.

57. The lithographic imaging apparatus according to clause 56, wherein the lithographic imaging apparatus comprises the remote computer for providing the processing parameter to the computer readable medium according to clause 50.

58. A database comprising the processing parameter for use in the method of any of the clauses 1 to 46 or for use in the computer readable medium of any of the clauses 47 to 51.

59. The database according to clause 58, wherein the database further comprises the processing window limiting pattern associated with the processing parameters.

60. A data carrier comprising the database according to any of the clauses 58 and 59.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The description is not intended to limit the invention.

The invention claimed is:

1. A defect determination or prediction method for a device manufacturing process involving processing a pattern onto a substrate, the method comprising:
   identifying a processing window limiting pattern from the pattern;
   obtaining a measured value of a processing parameter under which the processing window limiting pattern is processed; and
   determining or predicting, using the measured value of the processing parameter, or a value derived therefrom, and using a hardware-computer, an existence, probability of existence, a characteristic, or a combination thereof, of a defect produced from the processing window limiting pattern with the device manufacturing process.

2. The method of claim 1, wherein the determining or predicting the existence, the probability of existence, the characteristic, or the combination thereof, further uses a characteristic of the processing window limiting pattern, a characteristic of the pattern, or both.

3. The method of claim 1, further comprising adjusting, in the device manufacturing process, the processing parameter using the existence, the probability of existence, the characteristic, or the combination thereof, of the defect.

4. The method of claim 3, further comprising determining or predicting, using the adjusted processing parameter, an existence, probability of existence, a characteristic, or a combination thereof, of a residue defect produced from the processing window limiting pattern using the device manufacturing process.

5. The method of claim 4, further comprising indicating which one or more of a plurality of processing window limiting patterns to inspect at least partially based on the determined or predicted existence, probability of existence, the characteristic, or the combination thereof, of the residue defect.

6. The method of claim 1, further comprising determining a process window of the processing window limiting pattern.

7. The method of claim 6, wherein the determining or predicting the existence, the probability of existence, the characteristic, or the combination thereof, of the defect comprises comparing the measured value of the processing parameter, or the derived value therefrom, with the process window.

8. The method of claim 1, further comprising compiling the measured value of the processing parameter, or the derived value therefrom, into a processing parameter map.

9. The method of claim 1, wherein the processing window limiting pattern is identified using an empirical model or a computational model.

10. The method of claim 1, wherein the processing parameter is any one or more selected from: focus, dose, a source parameter, a projection optics parameter, a characteristics of a resist used on the substrate, a characteristic of development and post-exposure baking of a resist used on the substrate, and/or a characteristic of etching of a layer of the substrate.

11. The method of claim 1, wherein the determining or predicting the existence, the probability of existence, the characteristic, or the combination thereof, of the defect comprises simulating an image or expected patterning contours of the processing window limiting pattern under the processing parameter and determining an image or contour parameter.

12. A method of manufacturing a device using a device manufacturing process involving processing a pattern onto a substrate, the method comprising:
  obtaining a measured value of a processing parameter under which a previously identified processing window limiting pattern is processed;
  determining or predicting, using the measured value of the processing parameter, or a value derived therefrom, an existence, probability of existence, a characteristic, or a combination thereof, of a defect produced from the processing window limiting pattern with the device manufacturing process; and
  indicating which one or more of a plurality of processing window limiting patterns to inspect at least partially based on the determined or predicted existence, probability of existence, characteristic, or the combination thereof, of the defect.

13. The method of claim 12, further comprising adjusting, in the device manufacturing process, the processing parameter using the existence, the probability of existence, the characteristic, or the combination thereof, of the defect.

14. The method of claim 13, further comprising determining or predicting, using the adjusted processing parameter, an existence, probability of existence, a characteristic, or a combination thereof, of a residue defect produced from the processing window limiting pattern using the device manufacturing process.

15. The method of claim 12, further comprising inspecting, with an inspection apparatus, one or more substrates processed with the indicated one or more processing window limiting patterns.

16. A computer program product comprising a non-transitory computer readable medium having instructions recorded thereon, the instructions, when executed, are configured to cause a computer to at least:
  identify a processing window limiting pattern from the pattern;
  obtain a measured value of a processing parameter under which the processing window limiting pattern is processed; and
  determine or predict, using the measured value of the processing parameter, or a value derived therefrom, an existence, probability of existence, a characteristic, or a combination thereof, of a defect produced from the processing window limiting pattern with the device manufacturing process.

17. The computer program product of claim 16, wherein the instructions configured to cause determination or prediction of the existence, the probability of existence, the characteristic, or the combination thereof, of defect further use a characteristic of the processing window limiting pattern, a characteristic of the pattern, or both.

18. The computer program product of claim 16, further comprising instructions configured to provide information to enable adjustment, in the device manufacturing process, of the processing parameter using the existence, the probability of existence, the characteristic, or the combination thereof, of the defect.

19. The computer program product of claim 16, further comprising instructions configured to determine or predict, using a value of an adjusted processing parameter in the device manufacturing process, an existence, probability of existence, a characteristic, or a combination thereof, of a residue defect produced from the processing window limiting pattern using the device manufacturing process.

20. The computer program product of claim 16, further comprising instructions configured to determine a process window of the processing window limiting pattern and further comprising instructions configured to compare the measured value of the processing parameter, or the derived value therefrom, with the process window to determine or predict the existence, the probability of existence, the characteristic, or the combination thereof, of the defect.

* * * * *